(12) United States Patent
Rattaisutripalayam Palanisamy et al.

(10) Patent No.: US 12,394,705 B2
(45) Date of Patent: Aug. 19, 2025

(54) LAYOUT DESIGN OF CUSTOM STACK CAPACITOR TO PROCURE HIGH CAPACITANCE

(71) Applicant: QUALCOMM Incorporated, San Diego, CA (US)

(72) Inventors: Prakash Rattaisutripalayam Palanisamy, Bangalore (IN); Bruce Lee, Irvine, CA (US); Bavireddy Sai Krishna, Guntur (IN); Balavva Shivappa Kamatagi, Bailhongal (IN)

(73) Assignee: QUALCOMM INCORPORATED, San Diego, CA (US)

( * ) Notice: Subject to any disclaimer, the term of this patent is extended or adjusted under 35 U.S.C. 154(b) by 428 days.

(21) Appl. No.: 17/888,369

(22) Filed: Aug. 15, 2022

(65) Prior Publication Data
US 2024/0055346 A1 Feb. 15, 2024

(51) Int. Cl.
*H01L 23/522* (2006.01)
*H01L 23/528* (2006.01)
*H10D 1/68* (2025.01)
*H10D 84/80* (2025.01)

(52) U.S. Cl.
CPC ........ *H01L 23/5223* (2013.01); *H01L 23/528* (2013.01); *H10D 1/714* (2025.01); *H10D 84/813* (2025.01)

(58) Field of Classification Search
CPC ... H01L 23/5223; H01L 23/528; H10D 1/714; H10D 84/813; H10D 1/692; H10D 1/716; H10D 84/0158; H10B 17/28; H10B 12/033
See application file for complete search history.

(56) References Cited

U.S. PATENT DOCUMENTS

| 8,627,259 B2 | 1/2014 | Huang et al. | |
|---|---|---|---|
| 10,847,452 B2 | 11/2020 | Lin et al. | |
| 2008/0017906 A1* | 1/2008 | Pelella | H10D 86/01 257/373 |
| 2008/0230820 A1* | 9/2008 | Maeda | H10D 84/212 257/E29.345 |
| 2014/0367827 A1* | 12/2014 | Lee | H10D 84/212 257/532 |
| 2015/0084107 A1* | 3/2015 | Li | H10D 88/00 257/300 |
| 2016/0197071 A1* | 7/2016 | Yeh | H01L 23/485 438/396 |
| 2020/0043874 A1* | 2/2020 | Sira | G06F 30/367 |
| 2020/0091162 A1 | 3/2020 | Morris et al. | |
| 2022/0085145 A1 | 3/2022 | Shih et al. | |

FOREIGN PATENT DOCUMENTS

WO 2015076926 A1 5/2015

OTHER PUBLICATIONS

Partial International Search Report—PCT/US2023/069813—ISA/EPO—Sep. 28, 2023.
International Search Report and Written Opinion—PCT/US2023/069813—ISA/EPO—Dec. 21, 2023.

* cited by examiner

*Primary Examiner* — Galina G Yushina
(74) *Attorney, Agent, or Firm* — Loza & Loza, LLP

(57) ABSTRACT

A chip includes a first capacitor. The first capacitor includes first electrodes formed from metal layer M0, wherein the first electrodes are coupled to one another. The first capacitor also includes second electrodes formed from the metal layer M0, wherein the second electrodes are coupled to one another.

10 Claims, 13 Drawing Sheets

LAYOUT DESIGN OF CUSTOM STACK CAPACITOR TO PROCURE HIGH CAPACITANCE

BACKGROUND

Field

Aspects of the present disclosure relate generally to capacitors, and, more particularly, to layout of capacitors on a chip.

Background

Capacitors may be integrated on a chip (i.e., die). Integrated capacitors may be used, for example, as decoupling capacitors on supply rails. Integrated capacitors may also be used, for example, in filters, switch-capacitor circuits, analog-to-digital converters, digital-to-analog converters, and the like. Since silicon die cost is directly proportional to die area, it is desirable to fabricate high-density capacitors on the die to reduce the die area needed for the capacitors.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a chip including a first capacitor. The first capacitor includes first electrodes formed from metal layer M0, wherein the first electrodes are coupled to one another. The first capacitor also includes second electrodes formed from the metal layer M0, wherein the second electrodes are coupled to one another.

A second aspect relates to a chip including a capacitor. The capacitor includes first electrodes, wherein the first electrodes are coupled to one another, each of the first electrodes extends in a first direction, a first one of the first electrodes and a second one of the first electrodes are separated by a first gap in the first direction, and a third one of the first electrodes and a fourth one of the first electrodes are separated by a second gap in the first direction. The capacitor also includes second electrodes, wherein the second electrodes are coupled to one another, and each of the second electrodes extends in the first direction.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
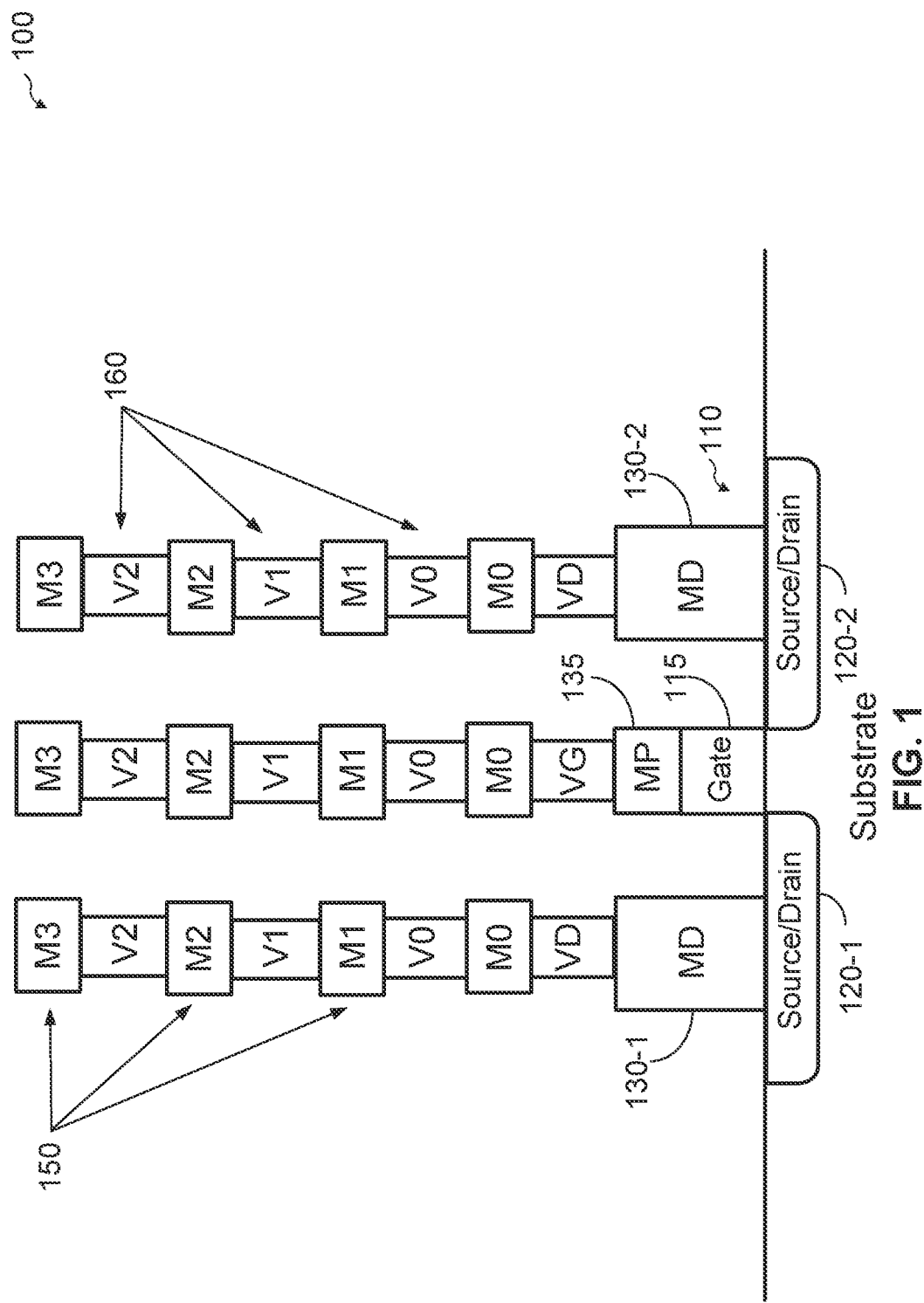
FIG. 1 shows a side view of an example of a chip including metal layers and vias according to certain aspects of the present disclosure.

FIG. 1 shows a side view of an example of a chip 100 (i.e., die) according to certain aspects. The chip 100 may include many devices (e.g., transistors) integrated on the chip 100. In this regard, FIG. 1 shows an example of a transistor 110 integrated on the chip 100. Although one transistor 110 is shown in FIG. 1 for simplicity, it is to be appreciated that the chip 100 may include many transistors. The chip 100 may also include stack capacitors, as discussed further below.

In the example shown in FIG. 1, the transistor 110 includes a gate 115, a first source/drain 120-1, and a second source/drain 120-2. As used herein, the term "source/drain" means source or drain. The gate 115 is formed over a channel between the first source/drain 120-1 and the second source/drain 120-2. The transistor 110 may also include a thin gate oxide (not shown) between the gate and the channel. The gate 115 may be a poly-silicon gate, a metal gate, or another type of gate. In the example shown in FIG. 1, the transistor 110 is depicted as a planar transistor. However, it is to be appreciated that the transistor 110 may be implemented with a fin field-effect transistor (FinFET), an example of which is discussed below with reference to FIGS. 2A and 2B. The transistor 110 may be part of the front end of line (FEOL) of the chip 100.

The chip 100 may also includes a first source/drain contact 130-1 formed on the first source/drain 120-1, and a second source/drain contact 130-2 formed on the second source/drain 120-2. The source/drain contacts 130-1 and 130-2 may be formed from a source/drain contact layer (labeled "MD" in FIG. 1) using, for example, a lithographic process and an etching process. Although the source/drain contact layer is labeled "MD" in the example in FIG. 1, it is to be appreciated that the source/drain contact layer may also be labeled "CA" or another label. The source/drain contact layer may include one or more metals and/or one or more other electrically conductive materials.

The chip 100 may also include a gate contact 135 formed on the gate 115. The gate contact 135 may be formed from a gate contact layer (labeled "MP" in FIG. 1) using, for example, a lithographic process and an etching process. Although the gate contact layer is labeled "MP" in the example in FIG. 1, it is to be appreciated that the gate contact layer may also be labeled with another label. The gate contact layer may include one or more metals and/or one or more other electrically conductive materials.

The chip 100 may also include a stack of metal layers 150. The metal layers 150 are patterned (e.g., using lithography and etching) to provide metal routing for the transistor 110 and other devices (not shown) on the chip 100. The metal routing may be used, for example, to interconnect devices on the chip 100, couple devices to a power source, couple devices to one or more input/output (I/O) pins, and the like. The metal layers 150 may also be used to form stack capacitors, as discussed further below. The metal layers 150 may also be referred to as metallization layers, or another term.

In the example in FIG. 1, the bottom-most metal layer in the stack of metal layers 150 may be designated metal layer M1 (also referred to as metal 1), the metal layer immediately above metal layer M1 may be designated metal layer M2 (also referred to as metal 2), the metal layer immediately above metal layer M2 may be designated metal layer M3 (also referred to as metal 3), and so forth. Although three metal layers are shown in FIG. 1 for ease of illustration, it is to be appreciated that the chip 100 may include additional metal layers (e.g., five or more metal layers including metal layer M4, metal layer M5, and so forth).

The chip 100 also includes vias 160 that provide electrical coupling between the metal layers 150. In this example, the vias V1 provide electrical coupling between metal layer M1 and metal layer M2, and the vias V2 provide electrical coupling between metal layer M2 and metal layer M3.

As discussed above, the metal layers 150 may also be used to form a stack capacitor (not shown in FIG. 1). For example, the metal layers 150 may be used to form a stack capacitor including multiple finger capacitors in which each finger capacitor is formed from a respective one of the metal layers 150. In this example, the finger capacitors may be stacked in the vertical direction to provide high capacitance density within a given die area. A finger capacitor may also be referred to as an interdigitated capacitor, or another term.

In advanced process nodes, a new metal layer (referred to as metal layer M0) has been introduced between metal layer M1 and device structures (e.g., the first source/drain 120-1, the second source/drain 120-2, and the gate 115) on the chip 100. Metal layer M0 is used as an intermediate metal layer used to couple device structures on the chip 100 to metal layer M1. In other words, a device structure is coupled to metal layer M1 through metal layer M0 in the advanced process nodes, while in prior process nodes a device structure is coupled to metal layer M1 without metal layer M0. In the example shown in FIG. 1, the source/drain contacts 130-1 and 130-2 are coupled to metal layer M0 by vias VD, and the gate contact 135 is coupled to metal layer M0 by via VG. Metal layer M0 is coupled to metal layer M1 by vias V0. As used here, "coupled" means electrically coupled unless stated otherwise.

Figure 2A:
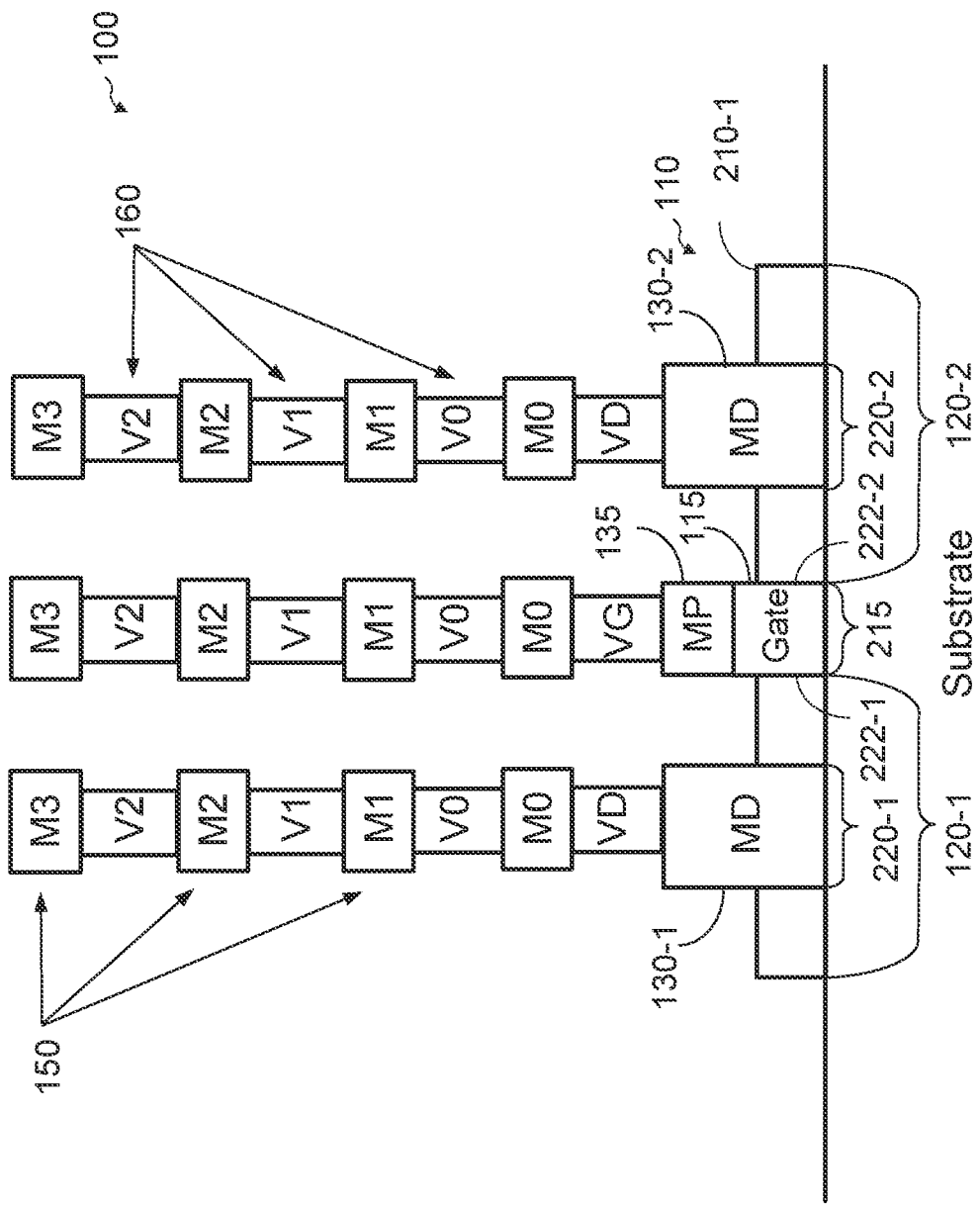
FIG. 2A shows a side view of an example of a fin field-effect transistor (FinFET) according to certain aspects of the present disclosure.
Figure 2B:
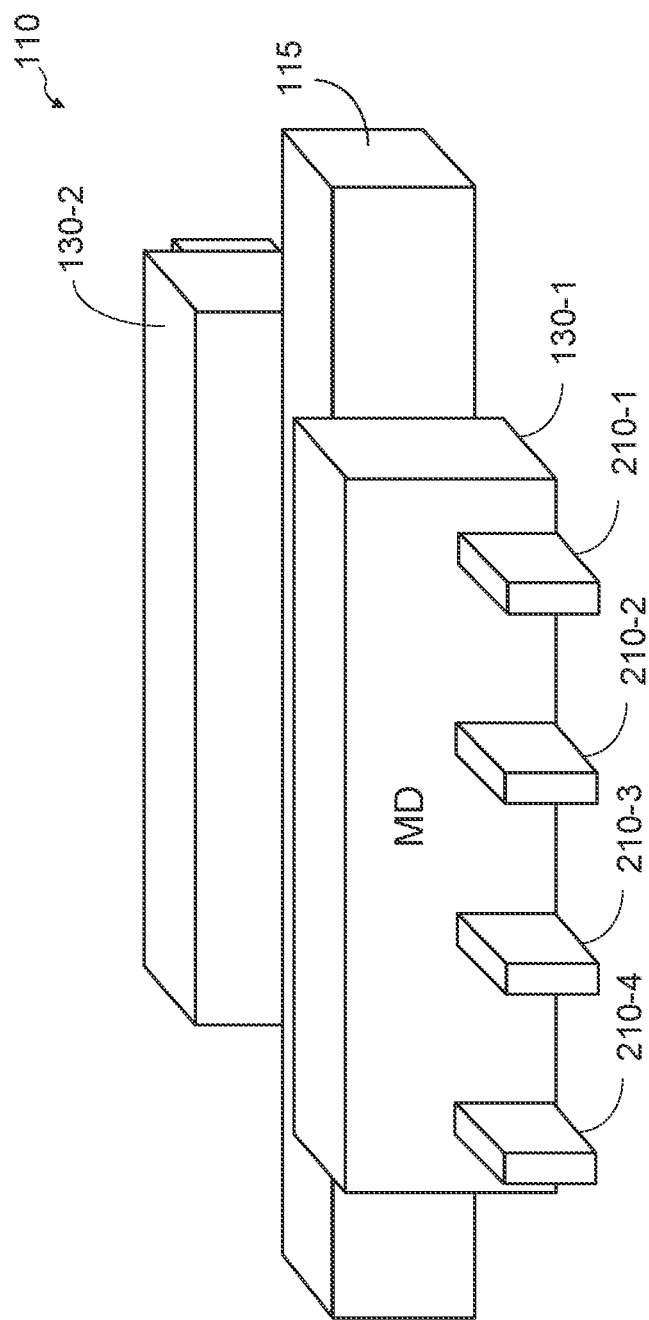
FIG. 2B shows a perspective view of the FinFET according to certain aspects of the present disclosure.

FIG. 2A shows a side view and FIG. 2B shows a perspective view of an example in which the transistor 110 is implemented with a FinFET. In this example, the transistor 110 includes fins 210-1 to 210-4 that extend perpendicularly with respect to the gate 115 and the source/drain contacts 130-1 and 130-2 (shown in FIG. 2B). Although four fins 210-1 to 210-4 are shown in the example in FIG. 2B, it is to be understood that the transistor 110 may include a different number of fins. Also, although the fins 210-1 to 210-4 are shown as having rectangular cross sections, it is to be understood that the fins may having other cross-sectional shapes (e.g., tapered cross sections). Note that the metal layers 150, the vias 160, and the gate contact 135 are not explicitly shown in FIG. 2B.

In this example, the gate 115 is formed over a first portion 215 of the fins 210-1 to 210-4. The gate 115 may wrap around three or more sides of each fin (e.g., the top side and two opposite sidewalls of each fin). In this example, the transistor 110 may also include a thin dielectric layer (not shown) interposed between the fins 210-1 to 210-4 and the gate 115. As shown in FIG. 2A, the gate contact 135 may be formed on the gate 115, and the via VG may electrically couple the gate contact 135 to metal layer M0.

A portion of the fins 210-1 to 210-4 extending from a first side 222-1 of the gate 115 forms the first source/drain 120-1, and a portion of the fins 210-1 to 210-4 extending from a second side 222-2 of the gate 115 forms the second source/drain 120-2, in which the first side 222-1 and the second side 222-2 are opposite sides of the gate 115. In this example, the first source/drain contact 130-1 is formed over a second portion 220-1 of the fins 210-1 to 210-4 on the first side 222-1 of the gate 115, and the second source/drain contact 130-2 is formed over a third portion 220-2 of the fins 210-1 to 210-4 on the second side 222-2 of the gate 115. Each of the source/drain contacts 130-1 to 130-2 may be made of a conductive material (e.g., one or more metals). As shown in FIG. 2A, the vias VD may electrically couple the source/drain contacts 130-1 to 130-2 to metal layer M0.

As discussed above, metal layer M0 is used as an intermediate metal layer to couple device structures (e.g., the first source/drain 120-1, the second source/drain 120-2, and the gate 115) to metal layer M1. To increase capacitance density (i.e., capacitance for a given die area), aspects of the present disclosure provide a finger capacitor formed from metal layer M0. In a stack capacitor, aspects of the present disclosure increase the number of finger capacitors in the stack capacitor by using an additional metal layer (e.g., metal layer M0) to form an additional finger capacitor in the stack capacitor. The above features and other features of the present disclosure are discussed further below according to various aspects.

Figure 3A:
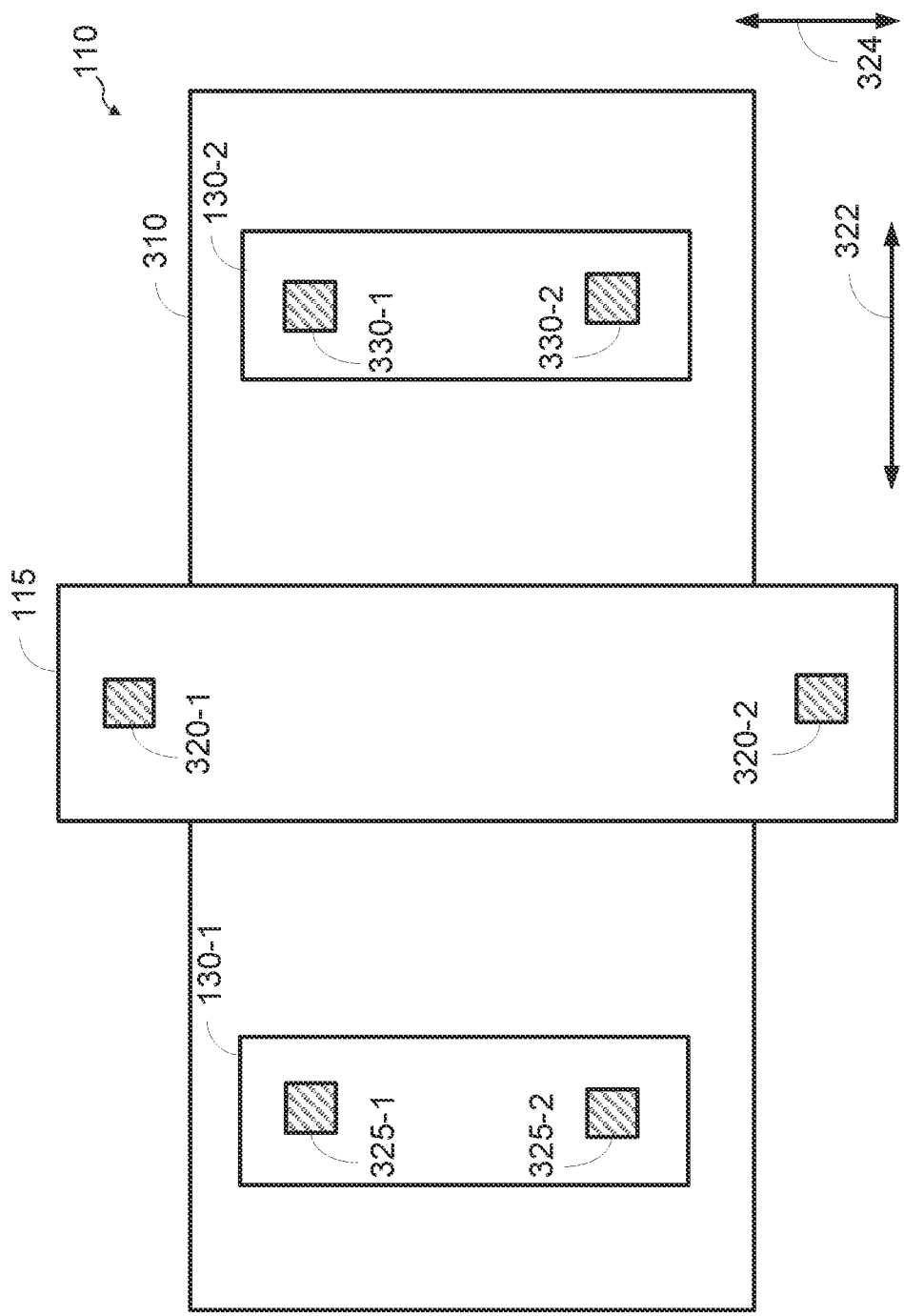
FIG. 3A shows a top view of a transistor according to certain aspects of the present disclosure.

FIG. 3A shows an exemplary top view of the transistor 110 according to certain aspects. As discussed further below, a finger capacitor (shown in FIG. 3B) is formed over the transistor 110 from metal layer M0. The transistor 110 may include an active region 310 including the first source/drain 120-1 and the second source/drain 120-2 (shown in FIGS. 1, 2A and 2B) of the transistor 110. For the example where the transistor 110 is implemented with a FinFET, the active region 310 includes the fins 210-1 to 210-4 (shown in FIGS. 2A and 2B) extending in lateral direction 322. As used here, a "lateral direction" is a direction that runs parallel to the substrate of the chip 100. The active region 310 may also be referred to as the active diffusion region, the oxide diffusion region, or another term.

The transistor 110 also includes the first source/drain contact 130-1, the second source/drain contact 130-2, and the gate 115. The gate 115 is located between the first source/drain contact 130-1 and the second source/drain contact 130-2. As discussed further below, the finger capacitor (shown in FIG. 3B) may electrically couple the first source/drain 120-1 and the second source/drain 120-2 together to configure the transistor 110 as a metal-oxide-semiconductor (MOS) capacitor. However, it is to be appreciated that the present disclosure is not limited to this example. In the example in FIG. 3A, the first source/drain contact 130-1, the second source/drain contact 130-2, and the gate 115 run parallel to one another and extend in lateral direction 324, which is perpendicular to lateral direction 322.

FIG. 3A also shows first vias 320-1 and 320-2 coupled to the gate 115. For the example where the gate contact 135 (shown in FIGS. 1 and 2A) is formed on the gate 115, the first vias 320-1 and 320-2 may be coupled to the gate 115 through the gate contact 135. In this example, the first vias 320-1 and 320-2 may be disposed on the gate contact 135. As discussed further below, the first vias 320-1 to 320-2 are used to couple the gate 115 to metal layer M0.

FIG. 3A further shows second vias 325-1 and 325-2 coupled to the first source/drain contact 130-1, and third vias 330-1 and 330-2 coupled to the second source/drain contact 130-2. For example, the second vias 325-1 and 325-2 may be disposed on the first source/drain contact 130-1, and the third vias 330-1 and 330-2 may be disclosure on the second source/drain contact 130-2. As discussed further below, the second vias 325-1 and 325-2 are used to couple the first source/drain contact 130-1 to metal layer M0 and the third vias 330-1 and 330-2 are used to couple the second source/drain contact 130-2 to metal layer M0.

Figure 3B:
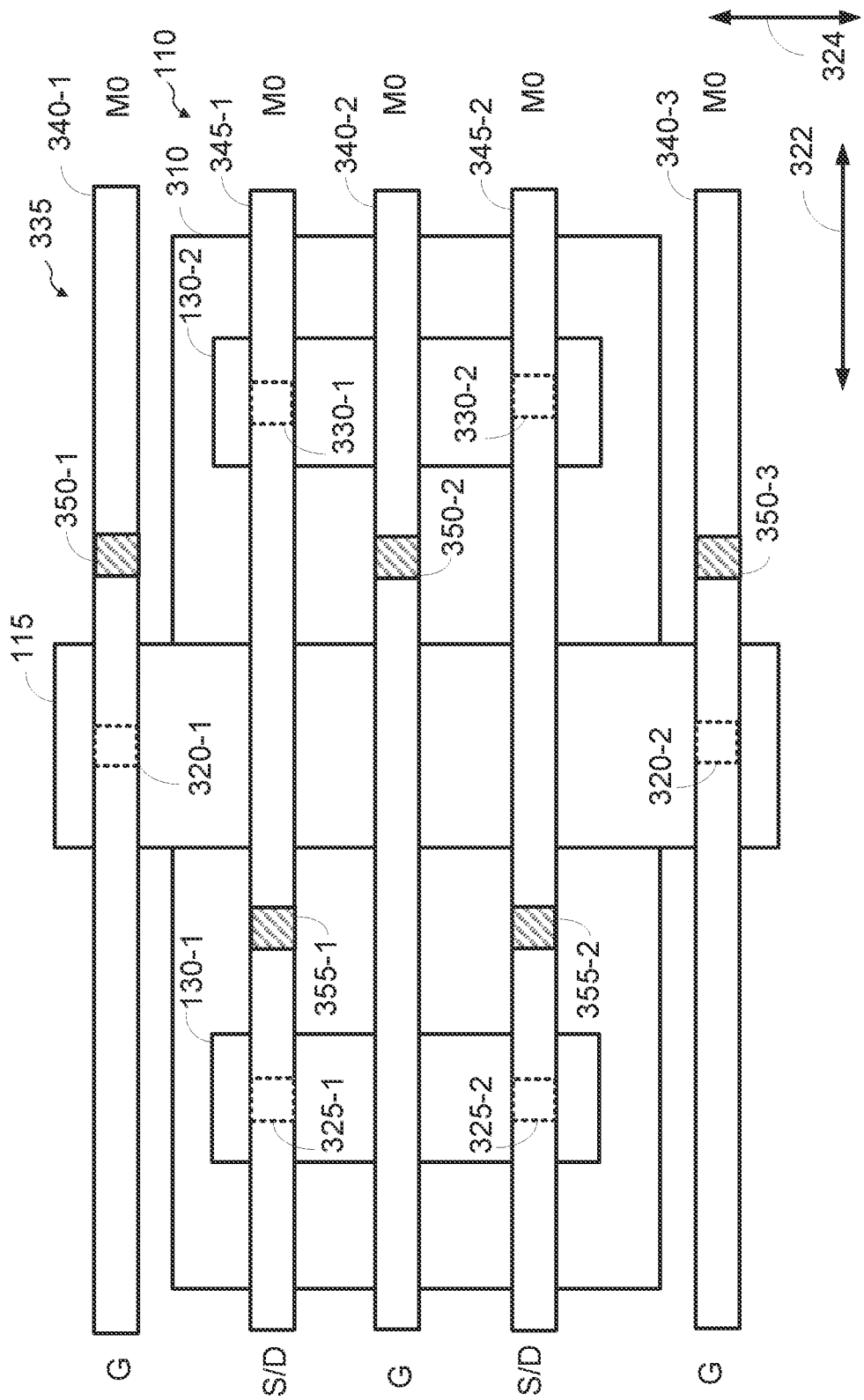
FIG. 3B shows an example of a finger capacitor formed over the transistor according to certain aspects of the present disclosure.

FIG. 3B shows an example of a finger capacitor 335 formed from metal layer M0 according to certain aspects. In this example, metal layer M0 is patterned to form first electrodes 340-1, 340-2, and 340-3, and second electrodes 345-1 and 345-2 (e.g., using a lithographic process and an etching process that patterns metal layer M0 into the individual electrodes). The electrodes 340-1, 340-2, 340-3, 345-1 and 345-2 are elongated and extend in lateral direction 322. In the example shown in FIG. 3B, the electrodes 340-1, 340-2, 340-3, 345-1 and 345-2 are spaced apart from one another in lateral direction 324, where lateral direction 324 is perpendicular to lateral direction 322. However, it is to be appreciated that the present disclosure is not limited to this example. As discussed further below, the first electrodes 340-1, 340-2, and 340-3 are coupled to a first terminal of the capacitor 335, and the second electrodes 345-1 and 345-2 are coupled to a second terminal of the capacitor 335. An electrode may also be referred to as a plate, a finger, or another term.

As shown in FIG. 3B, the first electrodes 340-1, 340-2, and 340-3 are interleaved with the second electrodes 345-1 and 345-2. In other words, the arrangement of the electrodes in the finger capacitor 335 alternates between the first electrodes 340-1, 340-2, and 340-3 and the second electrodes 345-1 and 345-2. The chip 100 may include a dielectric material between the electrodes 340-1, 340-2, 340-3, 345-1, and 345-2.

The first electrodes 340-1 and 340-3 are coupled to the gate 115 by the first vias 320-1 and 320-2. In the example shown in FIG. 3B, each of the first vias 320-1 and 320-2 is coupled between the gate 115 and a respective one of the first electrodes 340-1 and 340-3. Note that the first vias 320-1 and 320-2 are shown with dots in FIG. 3B to indicate that the first vias 320-1 and 320-2 are beneath the first electrodes 340-1 and 340-3, respectively. Also note that first electrode 340-2 is not couple to the gate 115 by a via in this example. As discussed further below, the first electrode 340-2 is coupled to the first electrodes 340-1 and 340-3 through metal layer M1.

The second electrodes 345-1 and 345-2 are coupled to the first source/drain contact 130-1 by second the vias 325-1 and 325-2. In the example shown in FIG. 3B, each of the second vias 325-1 and 325 is coupled between the first source/drain contact 130-1 and a respective one of the second electrodes 345-1 and 345-2. Note that the second vias 325-1 and 325-2 are shown with dots in FIG. 3A to indicate that the second vias 325-1 and 325-2 are beneath the second electrodes 345-1 and 345-2, respectively.

The second electrodes 345-1 and 345-2 are also coupled the second source/drain contact 130-2 by the third vias 330-1 and 330-2. In the example shown in FIG. 3B, each of the third vias 330-1 and 330-2 is coupled between the second source/drain contact 130-2 and a respective one of the second electrodes 345-1 and 345-2. Note that the third vias 330-1 and 330-2 are shown with dots in FIG. 3A to indicate that the third vias 330-1 and 330-2 are beneath the second electrodes 345-1 and 345-2, respectively.

Thus, in this example, the first source/drain contact 130-1 and the second source/drain contact 130-2 are coupled together through the second electrodes 345-1 and 345-2. This couples the first source/drain 120-1 and the second source/drain 120-2 together causing the transistor 110 to act as a MOS capacitor coupled in parallel with the finger capacitor 335. However, it is to be appreciated that the present disclosure is not limited to this example. For example, the finger capacitor 335 may be formed over another type of capacitor in other implementations. In some implementations, there may be no device below the finger capacitor 335.

FIG. 3B also shows fourth vias 350-1, 350-2, and 350-3 coupled to the first electrodes 340-1, 340-2, and 340-3, respectively. For example, each of the fourth vias 350-1, 350-2, and 350-3 may be disposed on a respective one of the first electrodes 340-1, 340-2, and 340-3. FIG. 3B also shows fifth vias 355-1 and 355-1 couple to the second electrodes 345-1 and 345-2. For example, each of the fifth vias 355-1 and 355-2 may be disposed on a respective one of the second electrodes 345-1 and 345-2.

Figure 3C:
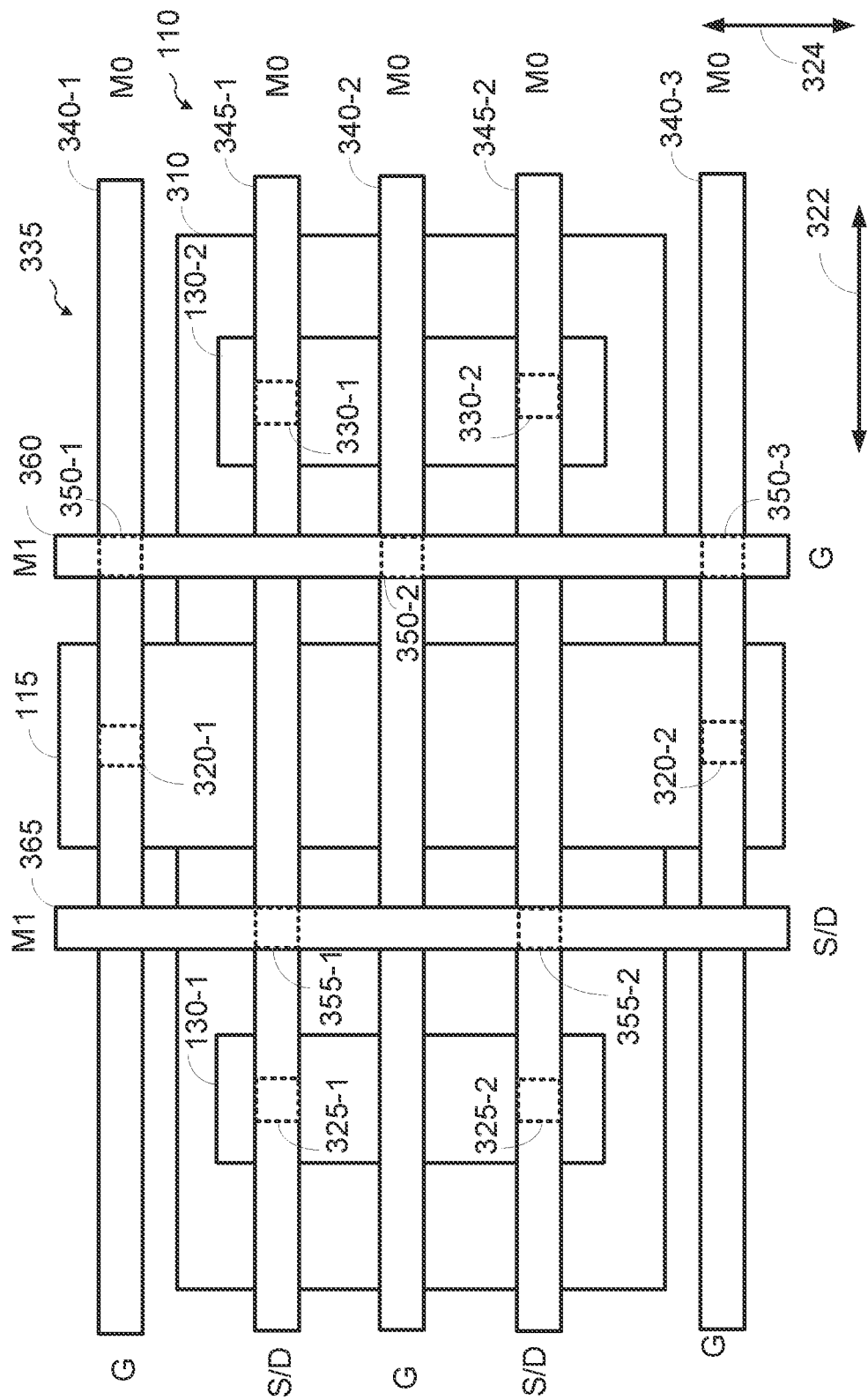
FIG. 3C shows an example of metal routing coupling electrodes of the finger capacitor in FIG. 3B according to certain aspects of the present disclosure.

FIG. 3C shows a first metal routing 360 and a second metal routing 365 formed from metal layer M1 (e.g., a lithographic process and an etching process to pattern metal layer M1 into the metal routings 360 and 365). In the example shown in FIG. 3C, each of the first metal routing 360 and the second metal routing 365 extends in lateral direction 324.

In this example, each of the fourth vias 350-1, 350-2, and 350-3 is coupled between the respective one of the first electrodes 340-1, 340-2, and 340-3 and the first metal routing 360. Thus, in this example, the first electrodes 340-1, 340-2, and 340-3 are coupled to one another through the first metal routing 360. In this example, the first metal routing 360 may serve as the first terminal of the finger capacitor 335 discussed above. The first metal routing 360 may also be used as an electrode of another finger capacitor formed from metal layer M1.

In this example, each of the fifth vias 355-1 and 355-2 is coupled between the respective one of the second electrodes 345-1 and 345-2 and the second metal routing 365. Thus, in this example, the second electrodes 345-1 and 345-2 are coupled to one another through the second metal routing 365. In this example, the second metal routing 365 may serve as the second terminal of the finger capacitor 335 discussed above. The second metal routing 365 may also be used as an electrode of another finger capacitor formed from metal layer M1.

The finger capacitor 335 may be used in a stacked capacitor that includes a stack of multiple finger capacitors formed from multiple metal layers. The use of metal layer M0 to form the finger capacitor 335 provides the stacked capacitor with increased capacitance density (i.e., capacitance for a given die area) by providing an additional metal layer (i.e., metal layer M0) to form an additional finger capacitor (i.e., finger capacitor 335) in the stacked capacitor. In certain aspects, the other finger capacitors (not shown) in the stacked capacitor may be stacked above the finger capacitor 335, in which the other finger capacitors may be formed from metal layer M1 to metal layer Mx where x is an integer greater than one.

It is to be appreciated that the present disclosure is not limited to the example shown in FIGS. 3A to 3C. For example, it is to be appreciated that the finger capacitor 335 may be formed above multiple devices. For example, in some implementations, the electrodes 340-1, 340-2, 340-3, 345-1, and 345-2 may extend in lateral direction 322 across multiple devices (e.g., transistors). It is also to be appreciated that the finger capacitor 335 may include additional electrodes in lateral direction 324 in addition to the electrodes 340-1, 340-2, 340-3, 345-1, and 345-2 shown in FIGS. 3A to 3C.

In the example in FIGS. 3B and 3C, each of the electrodes 340-1, 340-2, 340-3, 345-1, and 345-2 is shown as a contiguous metal line extending in lateral direction 322. However, it is to be appreciated that the electrodes 340-1, 340-2, 340-3, 345-1, and 345-2 are not limited to the exemplary shapes shown in FIGS. 3B and 3C, and that the electrodes 340-1, 340-2, 340-3, 345-1, and 345-2 may have other shapes.

It is to be appreciated that any reference to an element herein using a designation such as "first," "second," and so forth does not generally limit the quantity or order of those elements. Rather, these designations are used herein as a convenient way of distinguishing between two or more elements or instances of an element. For example, the fourth vias 350-1, 350-2, and 350-3, and the fifth vias 355-1 and 355-2 may also be referred to as first vias and second vias, respectively (e.g., for implementations where the transistor 110 is omitted). Also, the first vias 320- and 320-2, the second vias 325-1 and 325-2, and the third vias 330-1 and 330-2 may also be referred to as third vias, fourth vias, and fifth vias, respectively.

Figure 4A:
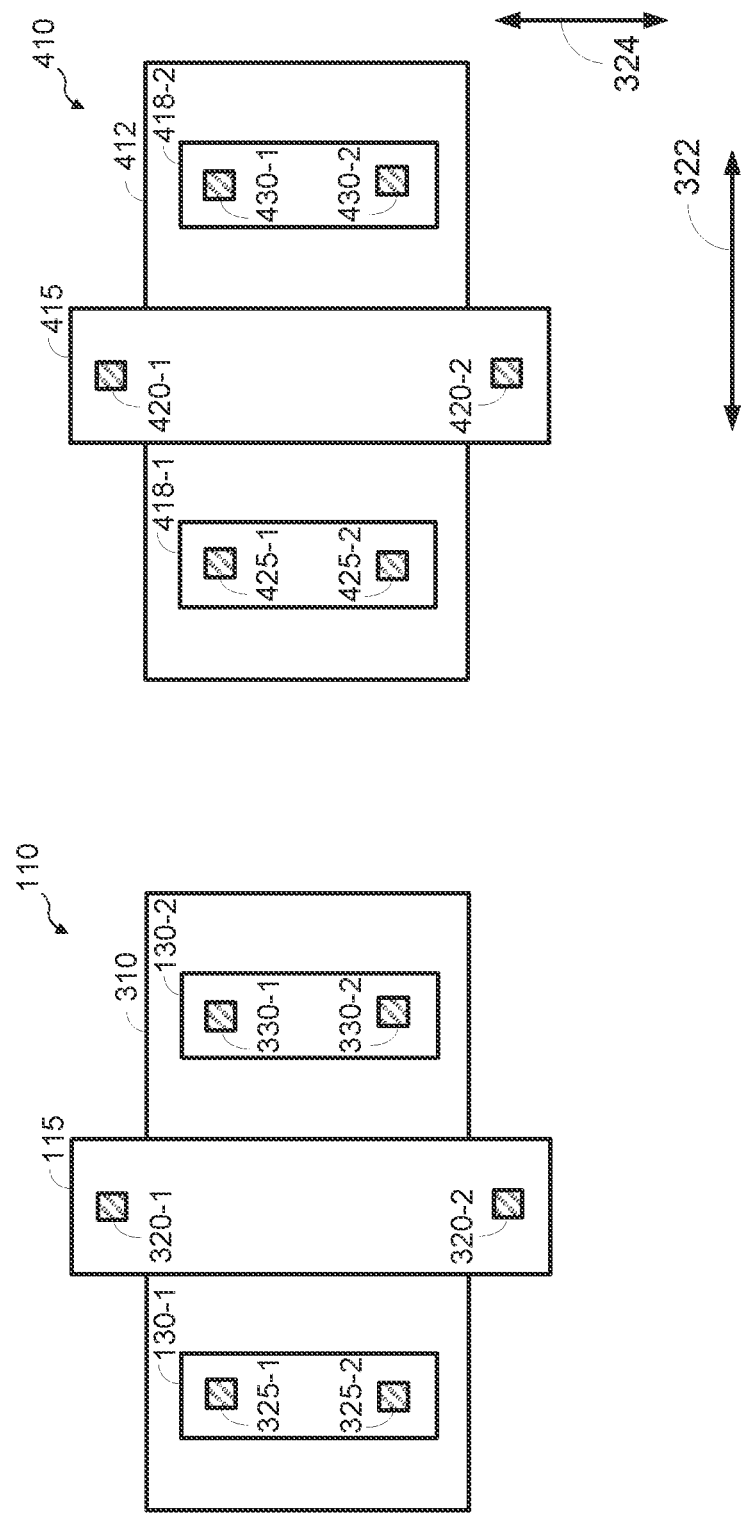
FIG. 4A shows a top view of transistors according to certain aspects of the present disclosure.

FIG. 4A shows an exemplary top view of the transistor 110 and a second transistor 410 according to certain aspects. In the discussion below, the transistor 110 is referred to as the first transistor 110, and the gate 115 is referred to as the first gate.

The first transistor 110 is discussed above according to various aspects. Accordingly, the description of the first transistor 110 is not repeated here for brevity. In certain aspects, the second transistor 410 may be a separate instance (i.e., copy) of the transistor 110. However, it is to be appreciated that this need not be the case. As discussed further below, a finger capacitor may be formed over the first transistor 110 and the second transistor 410 according to certain aspects. It is to be appreciated that the first transistor 110 and the second transistor 410 may be merged into a multi-gate transistor (also referred to as a multi-finger transistor) in some implementations.

In this example, the second transistor 410 includes an active region 412. For the example where the second transistor 410 is implemented with a FinFET, the active region 412 includes fins (e.g., similar to the fins 210-1 to 210-4 shown in FIGS. 2A and 2B) extending in lateral direction 322. For the example in which the first transistor 110 and the second transistor 410 are merged into a multi-gate transistor, the active region 412 may be merged with the active region 310 into one active region.

The second transistor 410 also includes a third source/drain contact 418-1, a fourth source/drain contact 418-2, and a second gate 415. The third source/drain contact 418-1 may be formed over a first source/drain of the second transistor 410, and the fourth source/drain contact 418-2 may be formed over a second source/drain of the second transistor 410. The second gate 415 is located between the third source/drain contact 418-1 and the fourth source/drain contact 418-2. In the example in FIG. 4A, the third source/drain contact 418-1, the fourth source/drain contact 418-2, and the second gate 415 run parallel to one another and extend in lateral direction 324.

FIG. 4A also shows fourth vias 420-1 and 420-2 coupled to the second gate 415. For the example where a second gate contact is formed on the second gate 415, the fourth vias 420-1 and 420-2 may be coupled to the second gate 415 through the gate contact. FIG. 4A also shows fifth vias 425-1 and 425-2 coupled to the third source/drain contact 418-1, and sixth vias 430-1 and 430-2 coupled to the fourth source/drain contact 418-2. For example, the fifth vias 425-1 and 425-2 may be disposed on the third source/drain contact 418-1, and the sixth vias 430-1 and 430-2 may be disposed on the fourth source/drain contact 418-2.

Figure 4B:
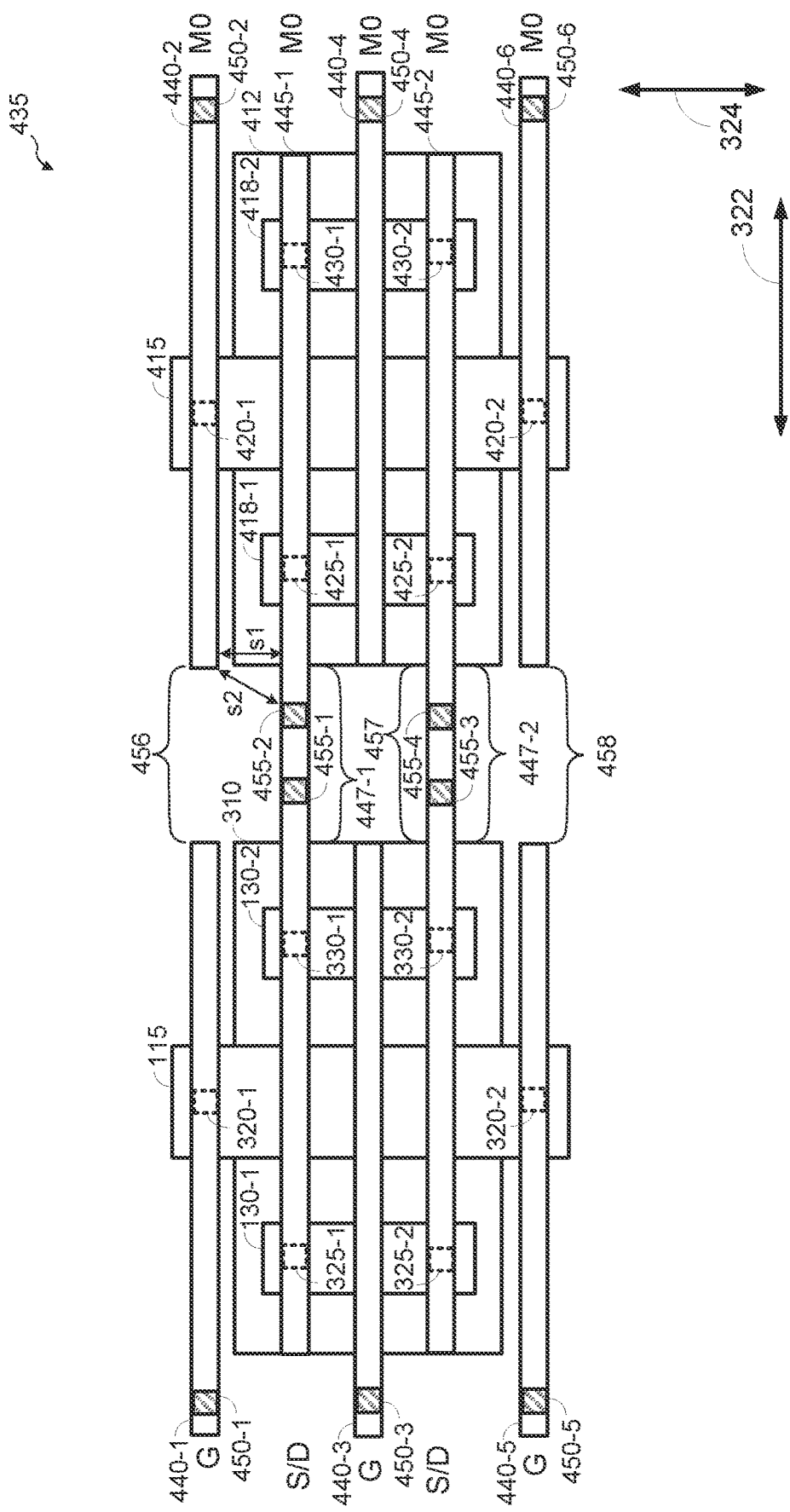
FIG. 4B shows an example of a finger capacitor formed over the transistors according to certain aspects of the present disclosure.

FIG. 4B shows an example of a finger capacitor 435 formed from metal layer M0 according to certain aspects. In this example, metal layer M0 is patterned to form first electrodes 440-1 to 440-6, and second electrodes 445-1 and 445-2 (e.g., using a lithographic process and an etching process that patterns metal layer M0 into the individual electrodes). The electrodes 440-1 to 440-6, 445-1, and 445-2 are elongated and extend in lateral direction 322. As discussed further below, the first electrodes 440-1 to 440-6 are coupled to a first terminal of the capacitor 435, and the second electrodes 445-1 and 445-2 are coupled to a second terminal of the capacitor 435.

In this example, first electrodes 440-1 and 440-2 are aligned in lateral direction 324 and are separated by a first gap 456 (i.e., space) in lateral direction 322, first electrodes 440-3 and 440-4 are aligned in lateral direction 324 and are separated by a second gap 457 in lateral direction 322, and first electrodes 440-5 and 440-6 are aligned in lateral direction 324 and are separated by a third gap 458 in lateral direction 322. In other words, the gaps 456, 457, and 458 separate first electrodes 440-1, 440-3, and 440-5 from first electrodes 440-2, 440-4, and 440-6 in lateral direction 322. The gaps 456, 457, and 458 may have approximately the same length in lateral direction 322. As discussed further below, the gaps 456, 457, and 458 may be used to increase capacitance density while complying with design rules for chip layout. It is to be appreciated that a gap between two electrodes may be filled with dielectric material (e.g., oxide). In other words, dielectric material may be disposed between first electrodes 440-1 and 440-2, between first electrodes 440-3 and 440-4, and between first electrodes 440-5 and 440-6.

In the example in FIG. 4B, second electrode 445-1 extends in lateral direction 322, in which a first portion of second electrode 445-1 is between first electrodes 440-1 and 440-3, a second portion of second electrode 445-1 is between first electrodes 440-2 and 440-4, and a third portion 447-1 of second electrode 445-1 is between the first and second portions of second electrode 445-1.

Second electrode 445-2 extends in lateral direction 322, in which a first portion of second electrode 445-2 is between first electrodes 440-3 and 440-5, a second portion of second electrode 445-2 is between first electrodes 440-4 and 440-6, and a third portion 447-2 of second electrode 445-2 is between the first and second portions of second electrode 445-2.

In the example in FIG. 4B, first electrodes 440-1 and 440-5 are coupled to the first gate 115 by the first vias 320-1 and 320-2, in which each of the first vias 320-1 and 320-2 is coupled between the first gate 115 and a respective one of the first electrodes 440-1 and 440-5. Note that, in FIG. 4B, vias below metal layer M0 are shown with dots. Second electrodes 445-1 and 445-2 are coupled to the first source/drain contact 130-1 by the second vias 325-1 and 325-2, in which each of the second vias 325-1 and 325-2 is coupled between the first source/drain contact 130-1 and a respective one of the second electrodes 445-1 and 445-2. Second electrodes 445-1 and 445-2 are coupled to the second source/drain contact 130-2 by the third vias 330-1 and 330-2, in which each of the third vias 330-1 and 330-2 is coupled between the second source/drain contact 130-2 and a respective one of the second electrodes 445-1 and 445-2.

In the example in FIG. 4B, first electrodes 440-2 and 440-6 are coupled to the second gate 415 by the fourth vias 420-1 and 420-2, in which each of the fourth vias 420-1 and 420-2 is coupled between the second gate 415 and a respective one of the first electrodes 440-2 and 440-6. Second electrodes 445-1 and 445-2 are coupled to the third source/drain contact 418-1 by the fifth vias 425-1 and 425-2, in which each of the fifth vias 425-1 and 425-2 is coupled between the third source/drain contact 418-1 and a respective one of the second electrodes 445-1 and 445-2. Second electrodes 445-1 and 445-2 are coupled to the fourth source/drain contact 418-2 by the sixth vias 430-1 and 430-2, in which each of the sixth vias 430-1 and 430-2 is coupled between the fourth source/drain contact 418-2 and a respective one of the second electrodes 445-1 and 445-2.

FIG. 4B also shows an example of seventh vias 450-1 to 450-6 in which each of the seventh vias 450-1 to 450-6 is coupled to a respective one of the first electrodes 440-1 to 440-6. For example, each of the seventh vias 450-1 to 450-6 may be disposed on the respective one of the first electrodes 440-1 to 440-6.

In the example shown in FIG. 4B, seventh vias 450-1, 450-3, and 450-5 are aligned in lateral direction 322, and seventh vias 450-2, 450-4, and 450-6 are aligned in lateral direction 322. Each of seventh vias 450-1, 450-3, and 450-5 is disposed on a portion of the respective first electrode 440-1, 450-3, and 450-5 that extends beyond the boundary of the active region 310 of the first transistor 110. Also, each of seventh vias 450-2, 450-4, and 450-6 is disposed on a portion of the respective first electrode 440-2, 440-4, and 440-6 that extends beyond the boundary of the active region 412 of the second transistor 410. However, it is to be appreciated that the present disclosure is not limited to this example.

FIG. 4B also shows an example of eighth vias 455-1 to 455-4 in which eighth vias 455-1 and 455-2 are coupled to second electrode 445-1 and eighth vias 455-3 and 455-4 are coupled to second electrode 445-2. In this example, eighth vias 455-1 and 455-2 are disposed on the third portion 447-1 of the second electrode 445-1. Also, eighth vias 455-3 and 455-4 are disposed on the third portion 447-2 of the second electrode 445-2.

As shown in FIG. 4B, the space between the first electrodes 440-1 to 440-6 and the second electrodes 445-1 and 445-2 is s1 in lateral direction 324. However, because of the gaps 456, 457, and 458 separating first electrodes 440-1, 440-3, and 440-5 from first electrodes 440-2, 440-4, and 440-6, the space between the eighth vias 455-1 to 455-4 and the first electrodes 440-1 to 440-6 may be s2, where s2 is greater than s1 (i.e., s2>s1), as shown in FIG. 4B. Thus, the gaps 456, 457, and 458 increase the space (i.e., distance) between the eighth vias 455-1 to 455-4 and the first electrodes 440-1 to 440-6. Without the gaps 456, 457, and 458, the space between the eighth vias 455-1 to 455-4 and the first electrodes 440-1 to 440-6 would be s1. The increased space between the eighth vias 455-1 to 455-4 and the first electrodes 440-1 to 440-6 allows the first electrodes 440-1 to 440-6 and the second electrodes 445-1 and 445-2 to be spaced closer together for higher capacitance density while still complying with design rules, as discussed further below.

In certain aspects, the layout of the chip may be governed by design rules provided by a foundry or another entity. The design rules may be specific to the fabrication process used to fabricate the chip 100. For example, the design rules may define a minimum spacing between the vias (e.g., eighth vias 455-1 to 455-4) on the second electrodes 445-1 and 445-2 and the first electrodes 440-1 to 440-6. For example, the minimum spacing may be defined to prevent the vias from unintentionally shorting the second electrodes 445-1 and 445-2 and the first electrodes 440-1 to 440-6 due to process variation. In this example, the design rules may allow the spacing between the eighth vias 455-1 to 455-4 and the first electrodes 440-1 to 440-6 to be equal to or greater than the minimum spacing but not less than the minimum spacing. During chip layout, the placement of the eighth vias 455-1 to 455-4 relative to the first electrodes 440-1 to 440-6 may be checked for compliance with the design rules in a process called design rule checking (DRC). The DRC helps ensure that the chip layout complies with the design rules.

In this example, the space s2 between the eighth vias 455-1 to 455-4 and the first electrodes 440-1 to 440-6 may be approximately equal to the minimum spacing defined by the design rules for compliance with the design rules. Since the space s1 between the first electrodes 440-1 to 440-6 and the second electrodes 445-1 and 445-2 is smaller than the space s2, the space s1 between the first electrodes 440-1 to 440-6 and the second electrodes 445-1 and 445-2 can be made smaller than the minimum spacing defined by the design rules while still complying with the design rules. The smaller (i.e., closer) space between the first electrodes 440-1 to 440-6 and the second electrodes 445-1 and 445-2 increases capacitance density of the finger capacitor 435. Thus, the gaps 456, 457, and 458 allow the first electrodes 440-1 to 440-6 and the second electrodes 445-1 and 445-2 to be spaced closer together for higher capacitance density.

Figure 4C:
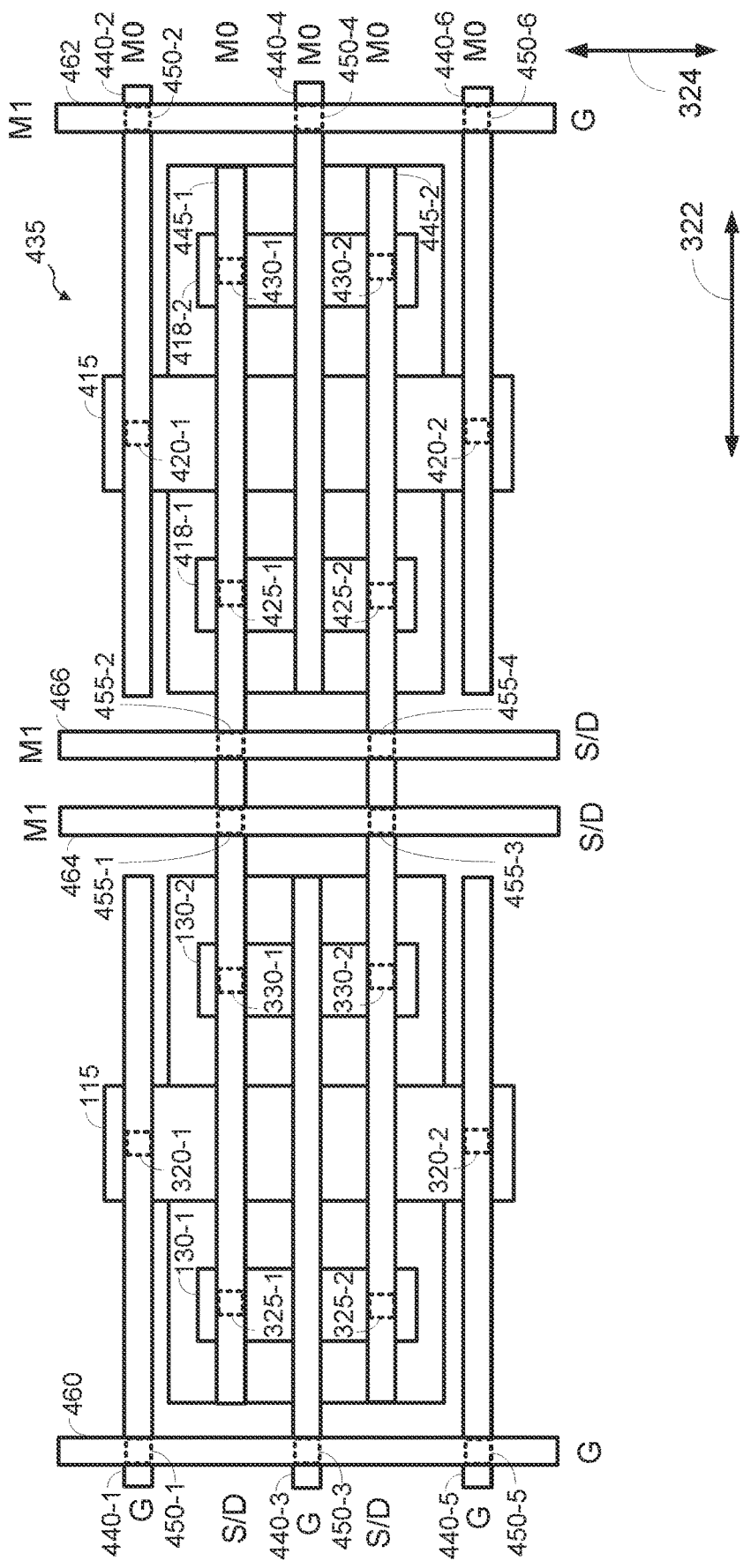
FIG. 4C shows an example of metal routing coupling electrodes of the finger capacitor in FIG. 4B according to certain aspects of the present disclosure.

FIG. 4C shows a first metal routing 460, a second metal routing 462, a third metal routing 464 and a fourth metal routing 466 formed from metal layer M1 (e.g., a lithographic process and an etching process to pattern metal layer M1 into the metal routings). In the example shown in FIG. 3C, each of the metal routings 460, 462, 464, and 466 is elongated and extends in lateral direction 324. It is to be appreciated that the metal routings 460, 462, 464, and 466 may also serve as electrodes for a capacitor formed above the finger capacitor 435.

In this example, each of the seventh vias 450-1, 450-3, and 450-5 is coupled between the respective one of the first electrodes 440-1, 440-3, and 440-5 and the first metal routing 460. Thus, in this example, first electrodes 440-1, 440-3, and 440-5 are coupled together through the first metal routing 460. Each of the seventh vias 450-2, 450-4, and 450-6 is coupled between the respective one of the first electrodes 440-2, 440-4, and 440-6 and the second metal routing 462. Thus, in this example, first electrodes 440-2, 440-4, and 440-6 are coupled together through the second metal routing 462.

Each of the eighth vias 455-1 and 455-3 is coupled between the respective one of the second electrodes 445-1 and 445-2 and the third metal routing 464, and each the eighth vias 455-2 and 455-4 is coupled between the respective one of the second electrodes 445-1 and 445-2 and the fourth metal routing 466. Thus, the second electrodes 445-1 and 445-2 are coupled together rough the third metal routing 464 and the fourth metal routing 466. In this example, the third metal routing 464 and the fourth metal routing 466 extend across the gaps 456, 457, and 458 in lateral direction 324.

Figure 4D:
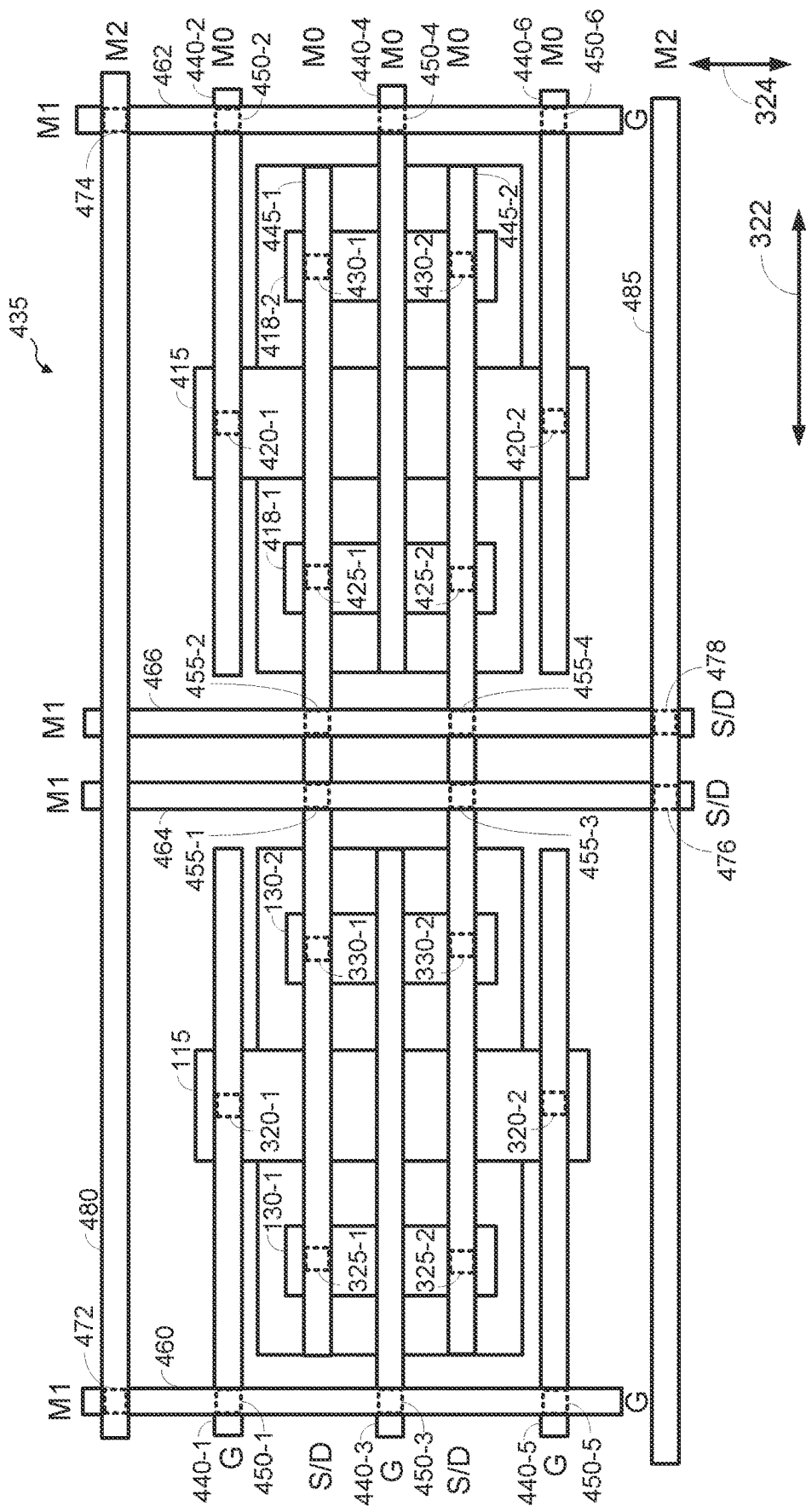
FIG. 4D shows an example of metal routing coupling the metal routing in FIG. 4C according to certain aspects of the present disclosure.

FIG. 4D shows a fifth metal routing 480 and a sixth metal routing 485 formed from metal layer M2 (e.g., a lithographic process and an etching process to pattern metal layer M2 into the metal routings). In the example shown in FIG. 3C, each of the metal routings 480 and 485 is elongated and extends in lateral direction 322. It is to be appreciated that the metal routings 480 and 485 may also serve as electrodes for a capacitor formed above the finger capacitor 435.

In this example, the fifth metal routing 480 extends from the first metal routing 460 to the second metal routing 462. The fifth metal routing 480 is coupled to the first metal routing 460 by via 472, which is coupled between the first metal routing 460 and the fifth metal routing 480. The fifth metal routing 480 is also coupled to the second metal routing 462 by via 474, which is coupled between the second metal routing 462 and the fifth metal routing 480. Thus, in this example, the first metal routing 460 is coupled to the second metal routing 462 through the fifth metal routing 480. Therefore, the first electrodes 440-1 to 440-6 are coupled together through the first metal routing 460, the second metal routing 462, and the fifth metal routing 480. In this regard, the first metal routing 460, the second metal routing 462, and/or the fifth metal routing 480 may be considered a first terminal of the finger capacitor 435 in this example. However, it is to be appreciated that the present disclosure is not limited to this example.

The sixth metal routing 485 is coupled to the third metal routing 464 by via 476, which is coupled between the third metal routing 464 and the sixth metal routing 485. The sixth metal routing 485 is also coupled to the fourth metal routing 466 by via 478, which is coupled between the fourth metal routing 466 and the sixth metal routing 485. Thus, in this example, the third metal routing 464 is coupled to the fourth metal routing 466 through the sixth metal muting 485. Therefore, the second electrodes 445-1 and 445-2 are coupled together through the third metal routing 464, the fourth metal routing 466, and the sixth metal routing 485. In this regard, the third metal routing 464, the fourth metal routing 466, and/or the sixth metal routing 485 may be considered a second terminal of the finger capacitor 435. However, it is to be appreciated that the present disclosure is not limited to this example.

Figure 5:
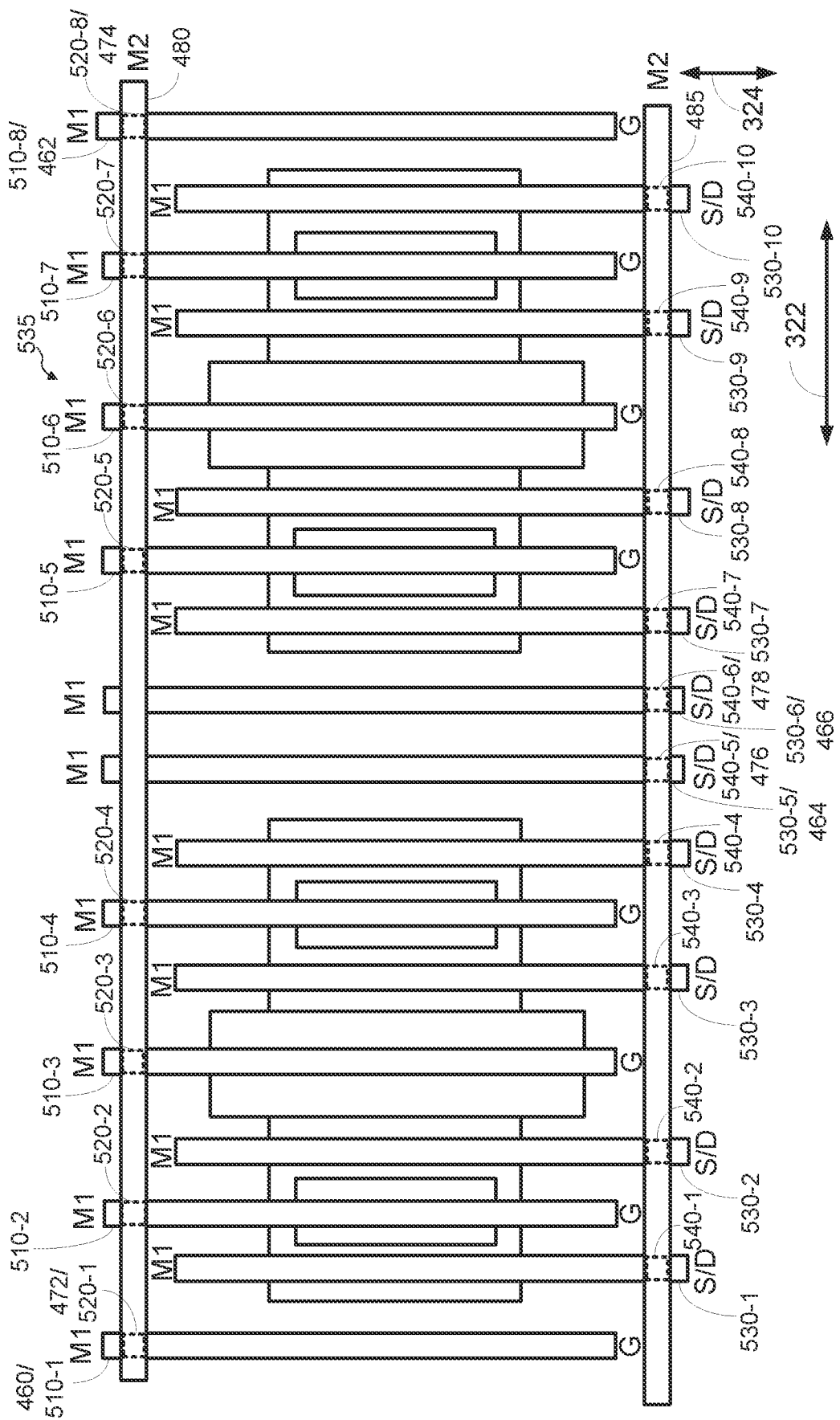
FIG. 5 shows an example of a second finger capacitor formed over the finger capacitor in FIG. 4B according to certain aspects of the present disclosure.

FIG. 5 shows an example of a finger capacitor 535 formed from metal layer M1 according to certain aspects. The finger capacitor 535 may be formed above the finger capacitor 435 and may be coupled in parallel with the finger capacitor 435. Note that the finger capacitor 435 is not shown in FIG. 5 for ease of illustration.

In this example, the finger capacitor 535 includes third electrodes 510-1 to 510-8 and fourth electrodes 530-1 to 530-10. The electrodes 510-1 to 510-8 and 530-1 to 530-10 may be formed, for example, using a lithographic process and an etching process that patterns metal layer M1 into the individual electrodes. In the example shown in FIG. 5, the electrodes 510-1 to 510-8 and 530-1 to 530-10 are elongated and extend in lateral direction 324. The third electrodes 510-1 to 510-8 may be interleaved with the fourth electrodes 530-1 to 530-10.

In certain aspects, third electrodes 510-1 and 510-8 may correspond to the first metal routing 460 and the second metal routing 462, respectively, as indicated in FIG. 5. Also, fourth electrodes 530-5 and 530-6 may correspond to the third metal routing 464 and the fourth metal routing 466, as indicated in FIG. 5. However, it is to be appreciated that the present disclosure is not limited to this example.

FIG. 5 shows ninth vias 520-1 to 520-8 in which each of the ninth vias 520-1 to 520-8 is coupled between a respective one of the third electrodes 510-1 to 510-8 and the fifth metal routing 480. Thus, in this example, the third electrodes 510-1 to 510-8 are coupled together through the fifth metal routing 480. In this regard, the fifth metal routing 480 may be considered a first terminal of the finger capacitor 535.

FIG. 5 also shows tenth vias 540-1 to 540-10 in which each of the tenth vias 540-1 to 540-10 is coupled between a respective one of the fourth electrodes 530-1 to 510-10 and the sixth metal routing 485. Thus, in this example, the fourth electrodes 530-1 to 530-10 are coupled together through the sixth metal routing 485. In this regard, the sixth metal routing 485 may be considered a second terminal of the finger capacitor 535.

Figure 6:
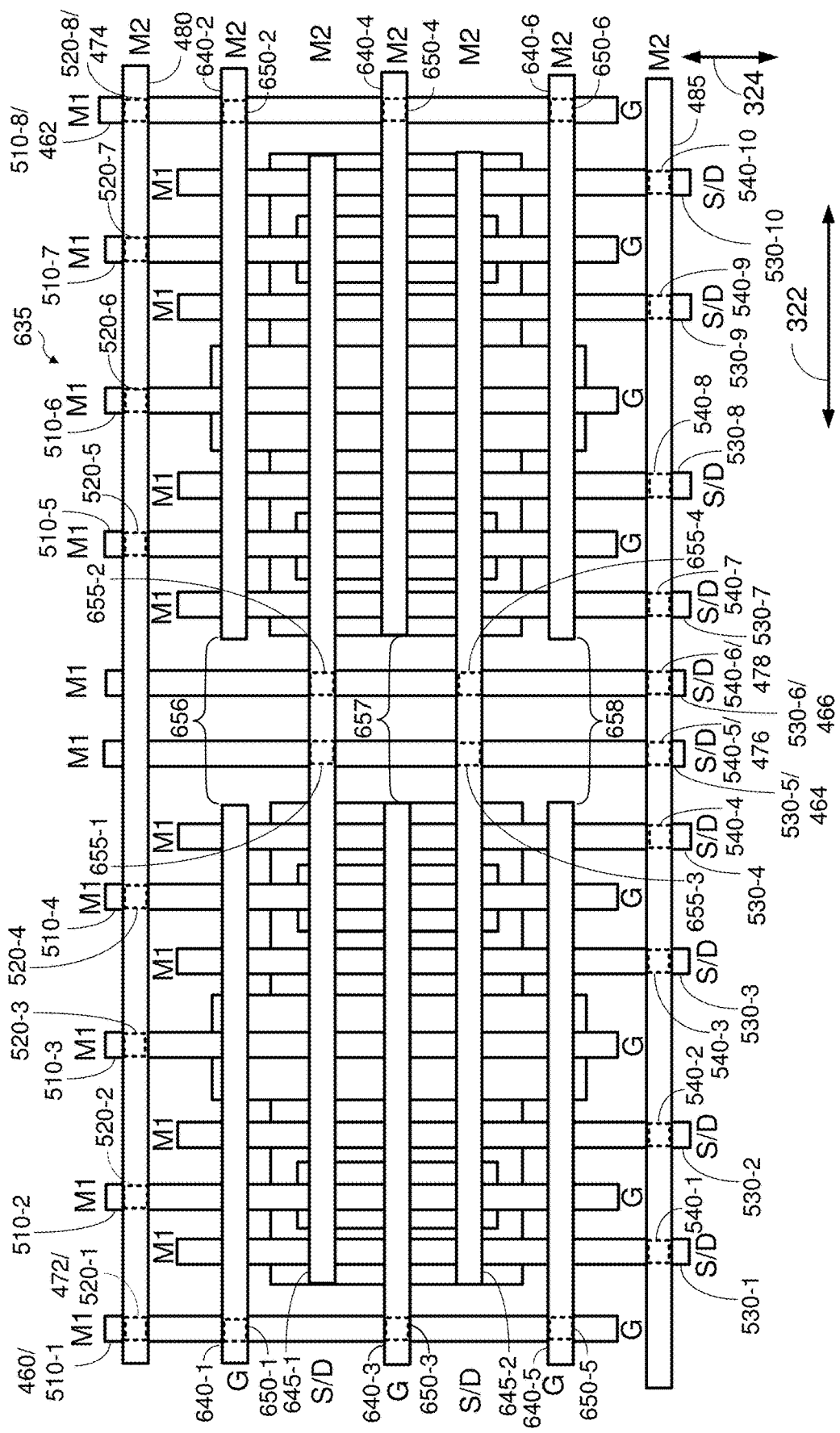
FIG. 6 shows an example of a third finger capacitor formed over the second finger capacitor according to certain aspects of the present disclosure.

FIG. 6 shows an example of a finger capacitor 635 formed from metal layer M2 according to certain aspects. In this example, metal layer M2 is patterned to form fifth electrodes 640-1 to 640-6, and sixth electrodes 645-1 and 645-2 (e.g., using a lithographic process and an etching process that patterns metal layer M2 into the individual electrodes). The electrodes 640-1 to 640-6, 645-1, and 645-2 are elongated and extend in lateral direction 322.

In this example, fifth electrodes 640-1 and 640-2 are aligned in lateral direction 324 and are separated by a first gap 656 (i.e., space) in lateral direction 322, fifth electrodes 640-3 and 640-4 are aligned in lateral direction 324 and are separated by a second gap 657 in lateral direction 322, and fifth electrodes 640-5 and 640-6 are aligned in lateral direction 324 and are separated by a third gap 658 in lateral direction 322. The gaps 656, 657, and 658 may have approximately the same length in lateral direction 322.

In the example in FIG. 6, sixth electrode 645-1 extends in lateral direction 322, in which a first portion of sixth electrode 645-1 is between fifth electrodes 640-1 and 640-3, a second portion of sixth electrode 645-1 is between fifth electrodes 640-2 and 640-4, and a third portion of sixth electrode 645-1 is between the first portion and the second portion.

Sixth electrode 645-2 extends in lateral direction 322, in which a first portion of sixth electrode 645-2 is between fifth electrodes 640-3 and 640-5, a second portion of sixth electrode 645-2 is between fifth electrodes 640-4 and 640-6, and a third portion of sixth electrode 645-2 is between the first portion and the second portion.

In the example in FIG. 6, fifth electrodes 640-1, 640-3, 640-5 are coupled to the first metal routing 460 by vias 650-1, 650-3, and 650-5, respectively, in which each of vias 650-1, 650-3, and 650-5 is coupled between the respective one of the fifth electrodes 640-1, 640-3, and 640-5 and the first metal routing 460. Fifth electrodes 640-2, 640-4, and 640-6 are coupled to the second metal routing 462 by vias 650-2, 650-4, and 650-6, respectively, in which each of vias 650-2, 650-4, 650-6 is coupled between the respective one of the fifth electrodes 640-2, 640-4, 640-6 and the second metal routing 462. In this example, the first metal routing 460 and the second metal routing 462 are coupled through the fifth metal routing 480. Thus, in this example, the fifth electrodes 640-1 to 640-6 are coupled together through the first metal routing 460, the second metal routing 462, and the fifth metal routing 480.

Sixth electrode 645-1 is coupled to the third metal routing 464 and the fourth metal routing 466 by vias 655-1 and 655-2, respectively, in which vias 655-1 is coupled between sixth electrode 645-1 and the third metal routing 464, and vias 655-2 is coupled between sixth electrode 645-1 and the fourth metal routing 466. Sixth electrode 645-2 is coupled to the third metal routing 464 and the fourth metal routing 466 by vias 655-3 and 655-4, respectively, in which vias 655-3 is coupled between sixth electrode 645-2 and the third metal routing 464, and vias 655-4 is coupled between sixth electrode 645-2 and the fourth metal routing 466. The third metal routing 464 and the fourth metal routing 466 are coupled through the sixth metal routing 485. Thus, in this example, the sixth electrodes 645-1 and 645-2 are coupled together through the third metal routing 464, the fourth metal routing 466, and the sixth metal routing 485.

Figure 7:
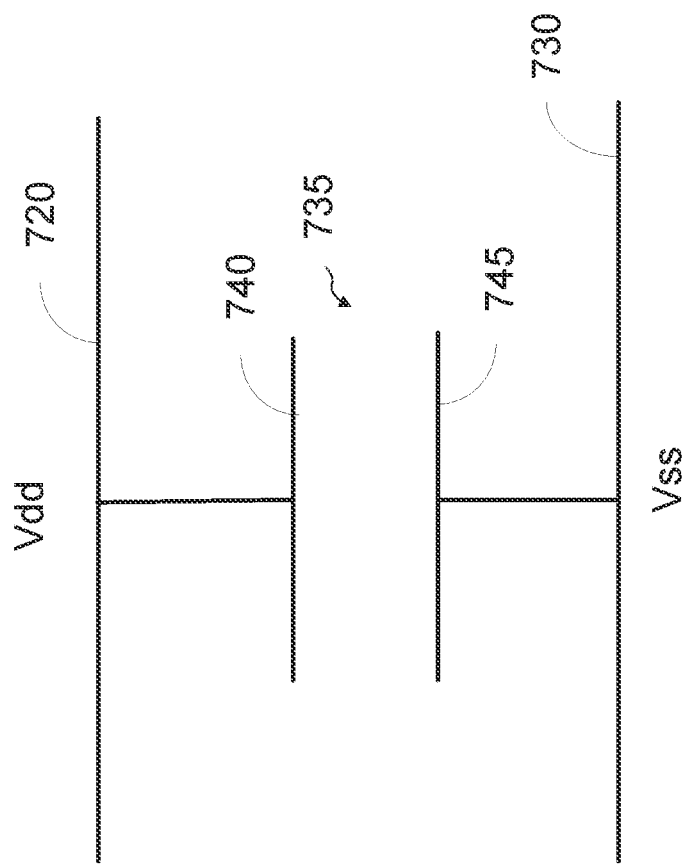
FIG. 7 shows an example of a decoupling capacitor according to certain aspects of the present disclosure.

As discussed above, a capacitor may be used as a decoupling capacitor. In this regard, FIG. 7 shows a circuit diagram of a decoupling capacitor 735 that may be implemented with any one of capacitor 335, 435, 535, and/or 635. One terminal 740 of the capacitor 735 is coupled to a voltage supply rail 720 (also referred to as a power rail) providing a supply voltage Vdd, and another terminal 745 of capacitor 735 is coupled to a lower rail 730 that is at a lower potential than the supply rail 720. For example, the lower rail 730 may be coupled to ground. When the capacitor 735 is implemented with any one of capacitor 335, 435, 535, and/or 635, the terminal 740 coupled to the supply rail 720 may correspond to the first terminal discussed above and the terminal 745 coupled to the ground rail 730 may correspond to the second terminal discussed above, or vice versa. However, it is to be appreciated that the present disclosure is not limited to this example, and that the capacitors discussed above according to various aspects may be used in other applications.

Implementation examples are described in the following numbered clauses:

1. A chip, comprising:
    a first capacitor comprising:
        first electrodes formed from metal layer M0, wherein the first electrodes are coupled to one another; and
        second electrodes formed from the metal layer M0, wherein the second electrodes are coupled to one another.
2. The chip of clause 1, wherein the first electrodes and the second electrodes are interleaved.
3. The chip of clause 1 or 2, wherein the first capacitor is above one or more transistors.
4. The chip of clause 3, wherein:
    the first electrodes are coupled to one or more gates of the one or more transistors; and
    the second electrodes are coupled to one or more source/drain contacts of the one or more transistors.
5. The chip of any one of clauses 1 to 4, further comprising:
    a first metal routing formed from metal layer M1, wherein the first electrodes are coupled to one another through the first metal routing; and
    a second metal routing formed from the metal layer M1, wherein the second electrodes are coupled to one another through the second metal routing.
6. The chip of any one of clauses 1 to 5, wherein each of the first electrodes and each of the second electrodes comprises a respective metal line.
7. The chip of any one of clauses 1 to 6, further comprising a second capacitor formed from metal layer M1, wherein the second capacitor is coupled in parallel with the first capacitor.
8. The chip of any one of clauses 1 to 7, wherein:
    each of the first electrodes and each of the second electrodes extends in a first direction;
    a first one of the first electrodes and a second one of the first electrodes are separated by a first gap in the first direction; and
    a third one of the first electrodes and a fourth one of the first electrodes are separated by a second gap in the first direction.
9. The chip of clause 8, wherein:
    a first portion of one of the second electrodes is between the first one of the first electrodes and the third one of the first electrodes; and
    a second portion of the one of the second electrodes is between the second one of the first electrodes and the fourth one of the first electrodes.
10. The chip of clause 9, wherein each of the first electrodes and each of the second electrodes comprises a respective metal line.
11. The chip of clause 9 or 10, further comprising one or more vias disposed on a third portion of the one of the second electrodes, wherein the third portion of the one of the second electrodes is between the first portion of the one of the second electrodes and the second portion of the one of the second electrodes.
12. The chip of clause 11, further comprising:
    a first metal routing formed from metal layer M1, wherein the first metal routing is coupled to the first one of the first electrodes and the third one of the first electrodes;
    a second metal routing formed from the metal layer M1, wherein the second metal routing is coupled to the second one of the first electrodes and the fourth one of the first electrodes; and
    a third metal routing formed from the metal layer M1, wherein the one or more vias are coupled between the one of the second electrodes and the third metal routing.
13. The chip of clause 12, wherein each of the first metal routing, the second metal routing, and the third metal routing extends in a second direction, and the second direction is perpendicular to the first direction.
14. The chip of clause 12 or 13, further comprising a fourth metal routing formed from metal layer M2, wherein the fourth metal routing is coupled to the first metal routing and the second metal routing.

15. The chip of any one of clauses 12 to 14, wherein:
the first metal routing and the third metal routing are located on opposite sides of a first gate; and
the third metal routing and the second metal routing are located on opposite sides of a second gate.

16. The chip of clause 15, wherein each of the first metal routing, the second metal routing, the third metal routing, the first gate, and the second gate extends in a second direction, and the second direction is perpendicular to the first direction.

17. A chip, comprising:
a capacitor comprising:
 first electrodes, wherein the first electrodes are coupled to one another, each of the first electrodes extends in a first direction, a first one of the first electrodes and a second one of the first electrodes are separated by a first gap in the first direction, and a third one of the first electrodes and a fourth one of the first electrodes are separated by a second gap in the first direction; and
 second electrodes, wherein the second electrodes are coupled to one another, and each of the second electrodes extends in the first direction.

18. The chip of clause 17, wherein:
a first portion of one of the second electrodes is between the first one of the first electrodes and the third one of the first electrodes; and
a second portion of the one of the second electrodes is between the second one of the first electrodes and the fourth one of the first electrodes.

19. The chip of clause 18, wherein each of the first electrodes and each of the second electrodes comprises a respective metal line.

20. The chip of clause 18 or 19, further comprising one or more vias disposed on a third portion of the one of the second electrodes, wherein the third portion of the one of the second electrodes is between the first portion of the one of the second electrodes and the second portion of the one of the second electrodes.

21. The chip of clause 20, further comprising:
a first metal routing coupled to the first one of the first electrodes and the third one of the first electrodes;
a second metal routing coupled to the second one of the first electrodes and the fourth one of the first electrodes; and
a third metal, wherein the one or more vias are coupled between the one of the second electrodes and the third metal routing.

22. The chip of clause 21, wherein each of the first metal routing, the second metal routing, and the third metal routing extends in a second direction, and the second direction is perpendicular to the first direction.

23. The chip of clause 21 or 22, further comprising a fourth metal routing, wherein the fourth metal routing is coupled to the first metal routing and the second metal routing.

24. The chip of any one of clauses 21 to 23, wherein:
the first metal routing and the third metal routing are located on opposite sides of a first gate; and
the third metal routing and the second metal routing are located on opposite sides of a second gate.

25. The chip of clause 24, wherein each of the first metal routing, the second metal routing, the third metal routing, the first gate, and the second gate extends in a second direction, and the second direction is perpendicular to the first direction.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A chip, comprising:
a first capacitor comprising:
 first electrodes formed from metal layer M0, wherein the first electrodes are coupled to one another;
 second electrodes formed from the metal layer M0, wherein the second electrodes are coupled to one another;
 wherein each of the first electrodes and each of the second electrodes extends in a first direction,
  a first one of the first electrodes and a second one of the first electrodes are separated by a first gap in the first direction,
  a third one of the first electrodes and a fourth one of the first electrodes are separated by a second gap in the first direction,
  a first portion of one of the second electrodes is between the first one of the first electrodes and the third one of the first electrodes, and
  a second portion of the one of the second electrodes is between the second one of the first electrodes and the fourth one of the first electrodes;
 one or more vias disposed on a third portion of the one of the second electrodes, wherein the third portion of the one of the second electrodes is between the first portion of the one of the second electrodes and the second portion of the one of the second electrodes;
 a first metal routing formed from metal layer M1, wherein the first metal routing is coupled to the first one of the first electrodes and the third one of the first electrodes;
 a second metal routing formed from the metal layer M1, wherein the second metal routing is coupled to the second one of the first electrodes and the fourth one of the first electrodes; and
 a third metal routing formed from the metal layer M1, wherein the one or more vias are coupled between the one of the second electrodes and the third metal routing, wherein
  the first metal routing and the third metal routing are located on opposite sides of a first gate, and
  the third metal routing and the second metal routing are located on opposite sides of a second gate.

2. The chip of claim 1, wherein each of the first electrodes and each of the second electrodes comprises a respective metal line.

3. The chip of claim 1, wherein each of the first metal routing, the second metal routing, and the third metal routing extends in a second direction, and the second direction is perpendicular to the first direction.

4. The chip of claim 1, further comprising a fourth metal routing formed from metal layer M2, wherein the fourth metal routing is coupled to the first metal routing and the second metal routing.

5. The chip of claim 1, wherein each of the first metal routing, the second metal routing, the third metal routing, the first gate, and the second gate extends in a second direction, and the second direction is perpendicular to the first direction.

6. A chip, comprising:
a capacitor comprising:
first electrodes, wherein the first electrodes are coupled to one another, each of the first electrodes extends in a first direction, a first one of the first electrodes and a second one of the first electrodes are separated by a first gap in the first direction, and a third one of the first electrodes and a fourth one of the first electrodes are separated by a second gap in the first direction; and
second electrodes, wherein the second electrodes are coupled to one another, and each of the second electrodes extends in the first direction, wherein
a first portion of one of the second electrodes is between the first one of the first electrodes and the third one of the first electrodes, and
a second portion of the one of the second electrodes is between the second one of the first electrodes and the fourth one of the first electrodes;
one or more vias disposed on a third portion of the one of the second electrodes, wherein the third portion of the one of the second electrodes is between the first portion of the one of the second electrodes and the second portion of the one of the second electrodes;
a first metal routing coupled to the first one of the first electrodes and the third one of the first electrodes;
a second metal routing coupled to the second one of the first electrodes and the fourth one of the first electrodes; and
a third metal, wherein the one or more vias are coupled between the one of the second electrodes and the third metal routing, wherein
the first metal routing and the third metal routing are located on opposite sides of a first gate, and
the third metal routing and the second metal routing are located on opposite sides of a second gate.

7. The chip of claim 6, wherein each of the first electrodes and each of the second electrodes comprises a respective metal line.

8. The chip of claim 6, wherein each of the first metal routing, the second metal routing, and the third metal routing extends in a second direction, and the second direction is perpendicular to the first direction.

9. The chip of claim 6, further comprising a fourth metal routing, wherein the fourth metal routing is coupled to the first metal routing and the second metal routing.

10. The chip of claim 6, wherein each of the first metal routing, the second metal routing, the third metal routing, the first gate, and the second gate extends in a second direction, and the second direction is perpendicular to the first direction.

* * * * *